United States Patent
Lye et al.

(10) Patent No.: US 9,413,394 B1
(45) Date of Patent: Aug. 9, 2016

(54) DIGITAL TO-ANALOG CONVERTER SYSTEM AND METHOD

(71) Applicant: PMC-SIERRA US, INC., Sunnyvale, CA (US)

(72) Inventors: William Michael Lye, Coquitlam (CA); John B. Groe, Poway, CA (US)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 0 days.

(21) Appl. No.: 14/676,142

(22) Filed: Apr. 1, 2015

Related U.S. Application Data

(60) Provisional application No. 61/973,558, filed on Apr. 1, 2014.

(51) Int. Cl.
 *H04L 27/00* (2006.01)
 *H04L 27/06* (2006.01)
 *H04B 1/00* (2006.01)

(52) U.S. Cl.
 CPC ............ *H04B 1/0014* (2013.01); *H04B 1/0025* (2013.01); *H04B 1/0082* (2013.01)

(58) Field of Classification Search
 USPC .......................... 375/219, 220, 221, 222, 240, 375/240.26–240.27, 284, 285, 295, 299, 375/316, 340, 346, 349, 350, 354, 358
 See application file for complete search history.

(56) References Cited

U.S. PATENT DOCUMENTS

| | | | | |
|---|---|---|---|---|
| 4,591,832 A | * | 5/1986 | Fling | H03M 1/662 341/141 |
| 7,221,300 B2 | | 5/2007 | Fontaine et al. | |
| 7,583,117 B2 | * | 9/2009 | Lin | H03L 7/07 327/149 |
| 8,022,850 B2 | * | 9/2011 | Newman | H03M 1/0665 341/143 |
| 8,548,071 B2 | * | 10/2013 | Collins | H03K 19/17744 326/8 |
| 8,805,296 B2 | * | 8/2014 | Miller | H04B 1/006 455/73 |
| 9,093,955 B2 | * | 7/2015 | Carlson | H03D 7/1408 |
| 2003/0020644 A1 | * | 1/2003 | Yeap | H03M 1/121 341/144 |
| 2007/0237259 A1 | * | 10/2007 | Wong | H04B 1/30 375/296 |
| 2011/0074613 A1 | * | 3/2011 | Newman | H03M 1/0665 341/143 |
| 2011/0097091 A1 | * | 4/2011 | Tao | H04B 10/505 398/183 |
| 2011/0299207 A1 | | 12/2011 | McMahill et al. | |
| 2011/0304489 A1 | * | 12/2011 | Christer | H03M 1/1019 341/118 |
| 2012/0195352 A1 | * | 8/2012 | Chiron | H03F 1/0222 375/219 |
| 2012/0269293 A1 | * | 10/2012 | Peng | H04B 1/0475 375/297 |
| 2012/0288018 A1 | * | 11/2012 | Osman | H04B 1/0475 375/259 |
| 2013/0120190 A1 | * | 5/2013 | McCune, Jr. | H01Q 3/2605 342/368 |

(Continued)

*Primary Examiner* — Linda Wong
(74) *Attorney, Agent, or Firm* — Dennis R. Haszko

(57) ABSTRACT

An Interleaved Radio Frequency Digital-to-Analog Converter (RF DAC) suitable for use in cellular base stations and optimized to give both a wide RF tuning range and a wide RF bandwidth is disclosed. The RF DAC uses two levels of interleaving, the first providing a direct conversion path from Base Band (BB) to RF, and the second providing a variable interleaving factor through the use of summation to optimize the output bandwidth as a function of the RF center frequency. Digital Interpolation, including an arbitrary sample rate conversion filter, allows the RF DAC to operate from a wide range of possible BB sample rates and the DAC sample rate is a fixed ratio of the RF center frequency. As a result, the spurious outputs from the RF DAC are in known locations that are relatively easy to filter out, minimizing the frequency planning tasks required for a complete RF system design.

16 Claims, 19 Drawing Sheets

(56) References Cited

U.S. PATENT DOCUMENTS

| | | | | |
|---|---|---|---|---|
| 2013/0272441 | A1* | 10/2013 | Uyehara | H04B 1/18 375/267 |
| 2014/0079098 | A1* | 3/2014 | Harjani | H04B 1/001 375/219 |
| 2014/0170997 | A1* | 6/2014 | Hung | H04B 1/04 455/127.2 |
| 2014/0286360 | A1* | 9/2014 | McHenry | H03F 1/3229 370/537 |
| 2014/0314184 | A1* | 10/2014 | Huang | H04L 27/3854 375/300 |
| 2015/0050030 | A1* | 2/2015 | Le Taillandier De Gabory | H04B 10/50595 398/183 |

* cited by examiner

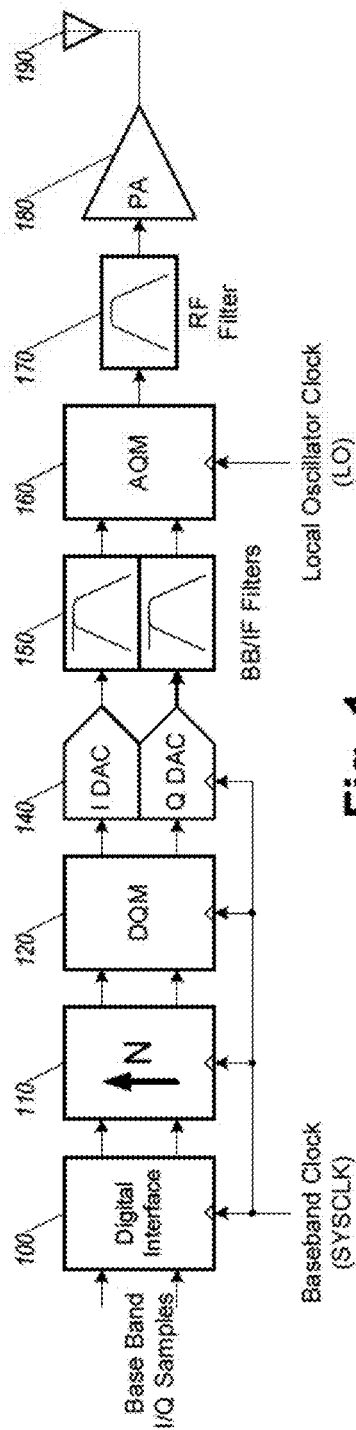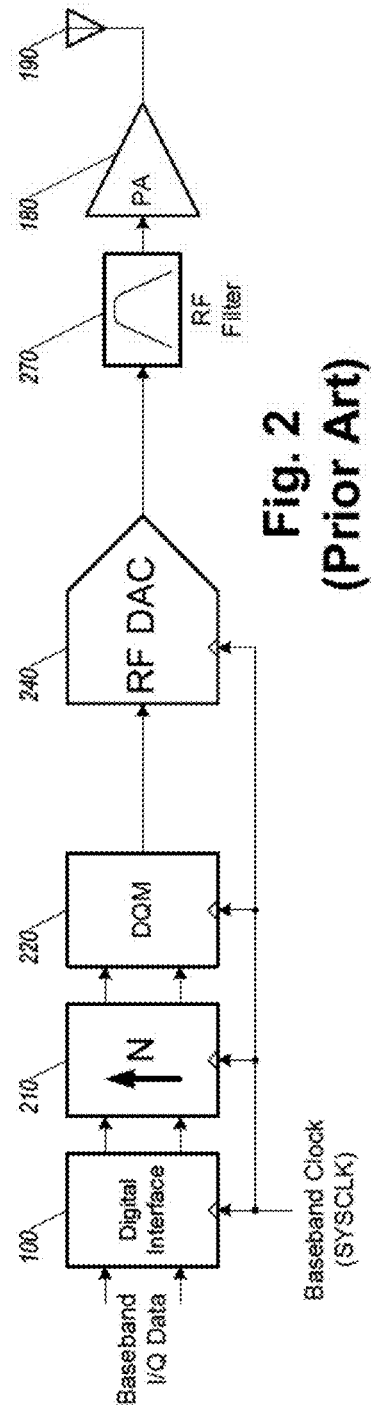

DIGITAL TO-ANALOG CONVERTER SYSTEM AND METHOD

CROSS REFERENCE TO RELATED APPLICATIONS

This application claims the benefit of priority of U.S. Provisional Patent Application No. 61/973,558 filed Apr. 1, 2014, which is hereby incorporated by reference.

FIELD

The present disclosure relates generally to Radio Frequency Digital-to-Analog Conversion. More particularly, the present disclosure relates to Radio Frequency Digital-to-Analog Conversion for application in cellular base stations.

BACKGROUND

Modern Multi-Band Radio Frequency (RF) systems, such as "4G" Cellular systems, are running into fundamental limitations of previous-generation systems, which requires system designers to fundamentally change the structure of the underlying system circuitry. Previous-generation systems are constructed, for the most part, using classic RF system techniques, such as analog mixers and separate analog Base Band and RF filters. Newer systems are transitioning to make use of two new classes of circuits: RF Digital/Analog Converters (RF DACs) and RF Analog/Digital Converters (RF ADCs). These RF converters push the Analog/Digital boundary much closer to the antenna, increasing the available RF bandwidth available and allowing for much more flexibility in the system, by pushing functionality that was previously in the analog circuits into digital circuits or even into software. This latter functionality is often called "Software Defined Radio", or SDR, and is seen as the ultimate in flexibility, allowing major functional changes of the RF system through a software or firmware download.

In order to understand an RF DAC, it is helpful to understand the fundamentals of a conventional RF transmit signal chain. FIG. 1 shows a representative previous-generation signal chain; not all previous-generation signal chains would contain all the elements of FIG. 1 and there may be variants, however the differences can be readily understood.

The signal chain accepts Base Band (BB) In-Phase/Quadrature (I/Q) sample data from the BBMedia Access Controller (MAC) through a Digital Interface 100. The I/Q data (that is, the I-data and the Q-data) is interpolated to a higher sample rate through an interpolator 110, and then is optionally modulated to adjust the center frequency to an Intermediate Frequency (IF) through a Digital Quadrature Modulator (DQM, 120). The interpolated and modulated I and Q digital signals are fed through two DACs (140) to produce an analog signal, which is filtered by two matched BB/IF filters (150). The filtered signal data is mixed using an Analog Quadrature Modulator (AQM, 160) with a Local Oscillator (LO) clock to produce an RF output. An RF Filter (170) filters the AQM output before amplifying it using a Power Amplifier (PA, 180) to produce the signal that will be actually transmitted by the antenna (190).

In addition to the circuit elements, FIG. 1 has two clocks. The first, the Base Band Clock (often referred to as SYSCLK), determines the sample data rate at the Digital Interface, and is also used to clock the Interpolator, DQM, and DACs. For convenience, FIG. 1 shows all blocks running from the same clock, SYSCLK, however depending upon the details of the actual system, some other clock SYSCLK·M (M being an integer) or SYSCLK/M might actually be used in a particular block. Powers of 2 (i.e. $2^N$) are commonly used for M because they allow for ready use of efficient Digital Signal Processor (DSP) filter techniques, but other factors may also be used. The second clock, the Local Oscillator clock (LO) drives the AQM and sets the center frequency of the transmitted RF output. The structure and operation of the AQM are well known to those skilled in the art.

One key difficulty in the design of a conventional RF transmit signal chain comes in the relationship between the two clock frequencies. SYSCLK is, of necessity, a standard fixed frequency; in cellular base stations, this is typically a power of 2 multiple of 122.88 MHz or 153.6 MHz, however other frequencies may be chosen depending upon the system design. LO is typically the center frequency of the desired RF signal band or is slightly offset from it and, depending upon the particular frequency band being used, can vary widely from system to system. Because these two frequencies (SYSCLK and LO) are set by two different constraints, they are often completely unrelated to each other, which in turn creates challenges in frequency planning.

Frequency planning essentially boils down to determining a pair of frequencies for SYSCLK and LO, together with an IF that when taken together create an interference-free range of frequencies for a desired RF band. Due to a number of practical circuit issues, harmonics of SYSCLK and LO will often mix together and create spurs, and if one of these spurs is in the desired RF band, performance of the RF system will be degraded. When desired RF bands are narrow, both as a fraction of the available BB/IF bandwidth and the LO frequency, frequency planning can be straightforward. However in modern RF systems, especially those that make use of Digital Pre-Distortion (DPD), the required RF bandwidths are becoming much wider relative both to the BB/IF bandwidth and the LO frequency and, as a result, the frequency planning challenges are becoming harder.

Another key difficulty in the design of a conventional RF transmit signal chain comes from the BB/IF filters. In these systems, the BB/IF filters are the point where the signals cross from one clock domain (SYSCLK) into the other (LO), therefore these filters, which smooth the discrete output signal generated by the DAC to make them appear to be continuous, often must have comparatively large attenuation at multiples of SYSCLK in order to attenuate images and to minimize any coupling between the two clock domains that could create spurs at the output. This requirement in turn requires that the BB/IF filters be of comparatively high order, which often creates significant design challenges. Some of the challenges relate to the cost (bill of materials), non-idealities, and filter design time. A high-order differential LC filter uses multiple high-precision components, which are expensive and occupy a large printed circuit board area. Amplitude and/or phase mismatch between the BB/IF filters introduce nonlinearities that degrade system performance. In addition, it is difficult to provide a flat filter response over a wide bandwidth. Any ripple or roll-off also degrades system response. Lastly, it is common for these radio systems to support different radio bands. It follows that the BB/IF filters will therefore need to be different for each radio band. This scales the design time as well as the number of components needed to realize the different BB/IF filters. This greatly complicates the radio system.

In early designs, IF's could be relatively large, and the signals going into the AQM were radically asymmetric in frequency. As a result, the BB/IF filters were truly bandpass IF filters, and every frequency band required a different filter design, which created additional challenges for RF system vendors in designing and maintaining many band-specific designs. As RF bandwidths increased, there was a push to increase the available bandwidth from the BB portion of the system, which in turn resulted in a push to Low-IF or Zero-IF (ZIF) systems. This modification reduced the need for band-specific designs, making these filters truly BB filters, however created an increased potential for additional effects due to mismatch between the I and Q filters. These effects, such as I/Q Impairment (IQI) and LO FeedThru (LOFT), become challenges that the system designer needs to deal with, either by increased production costs to tune the filters or, more commonly, by the addition of new blocks to measure these effects and correct for them in the digital domain.

RF DAC Transmit Signal Chains

Many modern RF transmit signal chains are moving to RF DACs, essentially DACs whose outputs are already modulated, in order to simplify the frequency planning challenges and remove the BB/IF filters, while at the same time increasing the available RF bandwidth at the antenna. An example of such a signal chain is shown in FIG. 2. In FIG. 2, and in all successive figures, an attempt has been made to use similar identification numbers to identify similar blocks. As with FIG. 1, BB I/Q samples are received from a MAC through the Digital Interface 100. These signals are interpolated to a higher sample rate with the interpolator 210, then modulated by the DQM 220, and converted to an analog signal by the RF DAC 240. The modulated signal is in turn filtered by an RF filer 270 and is then amplified by the PA 180 for transmission via the antenna 190.

For convenience, FIG. 2 shows all blocks driven by a single clock, SYSCLK, however as with FIG. 1, the various blocks are likely driven by multiple different clocks, all integer multiples of SYSCLK. In particular, because the RF DAC 240 is running at a significantly higher sample rate (Fs) than the I/Q DACs 140, the interpolator 210 and DQM 220 are similarly going to have significantly higher output sample rates than the interpolator 110 and DQM 120.

By performing the modulation in the digital domain, using DQM 220 instead of AQM 160, and by removing the BB/IF filters 150, all system issues caused by analog imperfections or mismatch have been removed. The challenges of maintaining multiple complex band-specific filter designs have also been removed, and furthermore because there is only a single clock domain in the system, the frequency planning challenges caused by having two clock domains are also gone, allowing greater freedom to increase RF bandwidths to accommodate modern system requirements.

Finally, because the characteristics at the output are completely determined by digital circuitry, system designers are free to envision new and different ways of constructing the systems, bringing the ability to increase system modularity and/or move to the ideal of having a Software-Defined Radio (SDR).

RF DAC Transmit Signal Chain Challenges

While the RF DAC Transmit Signal Chain of FIG. 2 has significant advantages over the conventional signal chain of FIG. 1, a system designer has several new challenges to overcome.

The first two RF DAC challenges are the so-called "sin(x)/x" or "sinc" response inherent to DAC designs and the images that come from the DAC discrete-time output. The output from a DAC over time is not a smooth continuous signal; it instead has a discrete-time staircase shape, sometimes called a "zero order hold". In turn, the zero-order hold has a frequency response that is given by the equation sin(x)/x, which is plotted in FIG. 3. The vertical axis of this figure is the frequency response in dB, while the horizontal axis is the output frequency as a fraction of Fs, which is the DAC sample rate or the DAC sampling frequency. As is shown, the sin(x)/x response creates a frequency response notch at Fs, meaning that all signal energy at the sample rate is completely attenuated. There are additional notches at Fs·2, Fs·3, and so on, however these are not shown. Also shown in FIG. 3 are the first and second "Nyquist Zones", which are frequency bands whose width is equal to the Nyquist Frequency Fs/2. Nyquist Zone 1 is a frequency band that extends from DC to Fs/2 and Nyquist Zone 2 is a frequency band that extends from Fs/2 to Fs. There are additional Nyquist Zones that extend beyond Fs that are not shown; for example Nyquist Zone 3 extends from Fs to Fs·3/2, while Nyquist Zone 4 extends from Fs·3/2 to Fs·2. Because the DAC output is a discrete-time signal, output signals that are centered on DC have images centered on Fs, Fs·2, Fs·3, and so on. Therefore, any signal energy in Nyquist Zone 1 will have an image (mirrored at Fs/2) in Nyquist Zone 2 and vice versa. There are additional images in all other Nyquist Zones, but for the purposes of this discussion this is not important.

Examining the sin(x)/x frequency response in FIG. 3, the challenges it causes are clear. FIG. 4 shows the frequency response of two representative RF signals 401 and 402 transmitted in Nyquist Zone 1. For example, if an RF system designer wished to use the RF signal 401, centered around Fs·0.125, there would only be approximately 1 dB of attenuation at the center frequency of the RF signal 401 due to the sin(x)/x response, which for most systems is relatively easy to accommodate. However, if the RF designer wished to use the RF signal 402 centered around Fs·0.375, there would be approximately 2 dB of attenuation at the center frequency of the RF signal 402, meaning that approximately 20% of the signal power is lost due to the sin(x)/x response. Additionally, as is shown at FIG. 4, sin(x)/x roll-off across the bands of the RF signals 401 and 402 can be significant, which means that the RF designer likely must compensate for this (most likely by using digital techniques) to create a flatter response over frequency.

Additionally, the images from these two RF signals 401 and 402 create challenges to the RF system designer. FIG. 4 shows the images 411 and 412 (in Nyquist Zone 2) of the RF signals 401 and 402 (in Nyquist Zone 1). Images 411 (centered at Fs·0.875) and 412 (centered at Fs·0.625) are both in Nyquist Zone 2. Image 411 is approximately 16 dB attenuated relative to frequency response of the RF signal 401, and is furthermore spaced relatively far away. As a result, the required RF filter 270 (shown in FIG. 2) required to reject the image 411 is relatively straight forward to construct. However, to use such a system for an RF center frequency of 4 GHz would require a sample frequency Fs of 32 Gsps (Giga samples per second), which is a significant challenge in and of itself. For comparison, if the RF signal 402 were to have a center frequency of 4 GHz, the required Fs would be a comparatively modest 10.67 Gsps. However, the image 412, is much closer to the RF signal 402 than the image 411 is to the RF signal 401, and is also only approximately 4 dB lower than RF signal 402. In general the larger an image is or the closer it is to the signal, the harder it is to filter out, which in turn requires a higher complexity (and cost) RF filter 270, which means that there is a direct engineering tradeoff between DAC sample rate and RF filter cost.

FIG. 5 shows an alternate approach, with RF signal 503 transmitted in Nyquist Zone 2 (centered at Fs·0.75) and its image 513 in Nyquist Zone 1 (centered at Fs·0.25). In this scenario, the image 513 is approximately 9 dB higher than the RF signal 503, however the signal-to-image spacing is significantly greater than that of RF signal 402 to image 412

(FIG. 4), which simplifies the design of the RF filter 270. For operation at 4 GHz, RF signal 503 requires a sample rate of only 5.33 Gsps, which is much lower than that required for either RF signals 401 or 402 of FIG. 4; however the DAC sin(x)/x response has attenuated the RF signal 503 by approximately 10 dB, meaning that approximately 90% of the signal power has been lost due to the DACs sin(x)/x response.

Another challenge that RF DACs pose for the RF system designer is again frequency planning. Like the two-clock frequency planning challenges of FIG. 1, the frequency planning challenges of a one-clock system, like FIG. 2, arise from the fixed-frequency BB clock SYSCLK. However unlike FIG. 1, where SYSCLK and LO are unrelated, in FIG. 2 the DAC's Fs (sample frequency) is a multiple of SYSCLK which means that the system designer must choose an appropriate multiple in order to make the challenges from sin(x)/x and images manageable. For example, an RF band centered around 4 GHz with a SYSCLK of 122.88 MHz and a signal placement similar to RF signal 402 (FIG. 4) requires a sample frequency Fs approximately 10.67 Gsps, or approximately SYSCLK·83. A multiple of 83 is challenging to accomplish; it is more likely that the system designer will chose a power of 2 (i.e. 64 or 128) or (much less likely) a power of 2 multiplied by a 3 or by 5 (i.e. 80 or 96). The further the chosen multiple is away from the ideal multiple, the less ideal the resulting system is. If the multiple (and therefore Fs) is too low, the closer the RF signal will be to the frequency response notch at Fs/2, and in fact, in this scenario, a multiple of 64 will actually result in the signal band ending up in Nyquist Zone 2. If the multiple (and therefore Fs) is too high, the RF DAC must run at a higher frequency.

One approach to operating in the Nyquist zone 2 that has been used in several recent designs makes use of what is called "Mix Mode" or "RF Mode". In this approach, the RF DAC is configured to produce an IF signal, and then the DAC inverts its output during the second half of every sample, usually using a slight variation on the Differential Quad Switching (DQS) technique. Referring now to FIG. 6, in one step this translates an IF signal 604 that was originally in Nyquist Zone 1 into an RF signal 604A in Nyquist Zone 2 and an image 614A of in Nyquist Zone 3, with only approximately 3 dB reduction in signal level due to sin(x)/x effects. While this technique is quite effective, it is only effective in Nyquist Zone 2 and the frequency spacing between RF signal 604A and image 614A must be considered (in Nyquist Zone 3) which reduces its utility somewhat.

Yet another shortcoming of RF DAC systems is the required DAC sample rate, Fs, and the resulting power that it dissipates. Simply put, the higher Fs is, the more complex the design of the RF DAC is and the more power it dissipates. Almost all RF DAC systems in use today are segmented CMOS current-mode designs, using arrays of matched current sources (each current source representing a DAC Least Significant Bit, or LSB) coupled to current steering structures (one per current source) that produce their outputs as differential currents. Most designs make use of Differential Quad Switching (DQS) approaches in order to minimize effects on the output caused by rise and fall mismatches. In CMOS logic, dynamic power increases linearly both with frequency and with the total capacitance being driven. The DQS structures are driven by arrays of digital latches, and delay mismatch between these latches appears as gain mismatch between individual LSB elements. In many modern RF DAC designs, LSB gain mismatch due to latch delay mismatches is the dominant source of mismatch, and in order to reduce this the devices that make up the latches are physically large, which increases the total capacitance being driven and therefore increases the power. As Fs increases, power increases, but additionally the required latch mismatch is reduced, so the devices are made even larger, with the end result that dynamic power in the latch array tends to increase at a higher rate than just with Fs. For a 4 GHz LO, this means that Fs=10.67 Gsps required for RF signal 402 (FIG. 4) will dissipate much less power than the Fs=32 Gsps required for RF signal 401 (FIG. 4), and Fs=5.67 Gsps required for RF signal 503 (FIG. 5) will dissipate even less. In fact, depending upon the technology the RF DAC is implemented in (Silicon CMOS, BiCMOS, or bipolar or exotic process such as SiGe, GaAs, or InP) and the minimum feature size (180 nm, 130 nm, 90 nm, 65 nm, 40 nm, 28 nm, 20 nm, or smaller) it may not even be possible to implement the chosen Fs without moving to a totally different architecture, which may increase power even more.

Taken together, the DAC sin(x)/x response, the DAC images, frequency planning, and power dissipation mean that the RF DAC transmit signal chain designer has a large design space to choose from, trading off RF DAC sample rate and architecture, RF filter complexity, and digital complexity all in order to achieve the required target specifications while overcoming all these challenges. If the RF system is intended to cover a wide range of LOs, as in a modern 4G system where LO's can potentially cover a continuous range approximately 400 MHz to 4 GHz, all the design space is much larger, because now the system must either be designed to accommodate the worst-case combination of conditions or the system must be reconfigured depending upon the LO frequency in order to remain efficient.

To date, available RF DAC solutions have not simultaneously provided a wide LO frequency range, high RF bandwidths, simple frequency planning, and high power efficiency.

Therefore, improvements in RF DACs are desirable.

SUMMARY

In a first aspect, the present disclosure provides a radio frequency digital-to-analog converter (DAC) system. The system comprises a first DAC to receive a first sample stream and to generate a first DAC output, a second DAC to receive a second sample stream and to generate a second DAC output; and a multiplexer unit to obtain the first DAC output and the second DAC output, the multiplexer unit to calculate a complementary output from the first DAC output to obtain a complementary first DAC output and a complementary output from the second DAC output to obtain a complementary second DAC output, the multiplexer to generate an interleaved output signal that contains a repeating sequence defined by: first DAC output, complementary second DAC output, complementary first DAC output, and second DAC output, the first DAC and the second DAC being clocked by a local oscillator, the repeating sequence spanning a single period of the local oscillator.

In a second aspect, the present disclosure provides a method of effecting digital-to-analog conversion. The method comprises: converting a first analog sample stream into a first output, the first output being a first digital output; generating a complementary output of the first output to obtain a first complementary output; converting a second analog sample stream into a second output, the second output being a second digital output; generating a complementary output of the second output to obtain a second complementary output; multiplexing the first output, the first complementary output, the second output, and the second complementary output to obtain an interleaved signal that contains a repeating sequence defined by: first output, second complementary output, first complementary output, and second output, a conversion of the first analog sample stream and of the second analog sample stream being effected in accordance with a local oscillator, the repeating sequence spanning a single period of the local oscillator.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 1 shows a prior art RF Transmit Signal Chain.

FIG. 2 shows a prior art Single-Clock RF DAC Transmit Signal Chain.

DETAILED DESCRIPTION

Generally, the present disclosure provides a method and system for Radio Frequency Digital-to-Analog Conversion. Embodiments of the RF DAC architecture of the present disclosure incorporate many individual elements, both analog and digital. Many of the elements are innovative, as is the combination of elements to produce the overall RF DAC.

The present disclosure provides an Interleaved Radio Frequency Digital-to-Analog Converter (RF DAC) suitable for use in cellular base stations and optimized to give both a wide RF tuning range and a wide RF bandwidth. The RF DAC uses two levels of interleaving, the first providing a direct conversion path from Base Band (BB) to RF, and the second providing a variable interleaving factor through the use of summation of DAC outputs to optimize the output bandwidth as a function of the RF center frequency. Digital Interpolation, including an arbitrary sample rate conversion filter, allows the DAC to operate from a wide range of possible BB sample rates; the RF DAC sample rate is a fixed ratio of the RF center frequency. As a result, the spurious outputs from the RF DAC are at known locations that are easy to filter out, minimizing the frequency planning tasks required for a complete n RF system design. In certain embodiments, the RF DAC of the present disclosure is frequency-agile, power efficient, and is capable of covering an LO frequency range from at least 400 MHz to 4 GHz, with a wide RF bandwidth that is at least 800 MHz at LO frequencies greater than 1 GHz.

Figure 3:
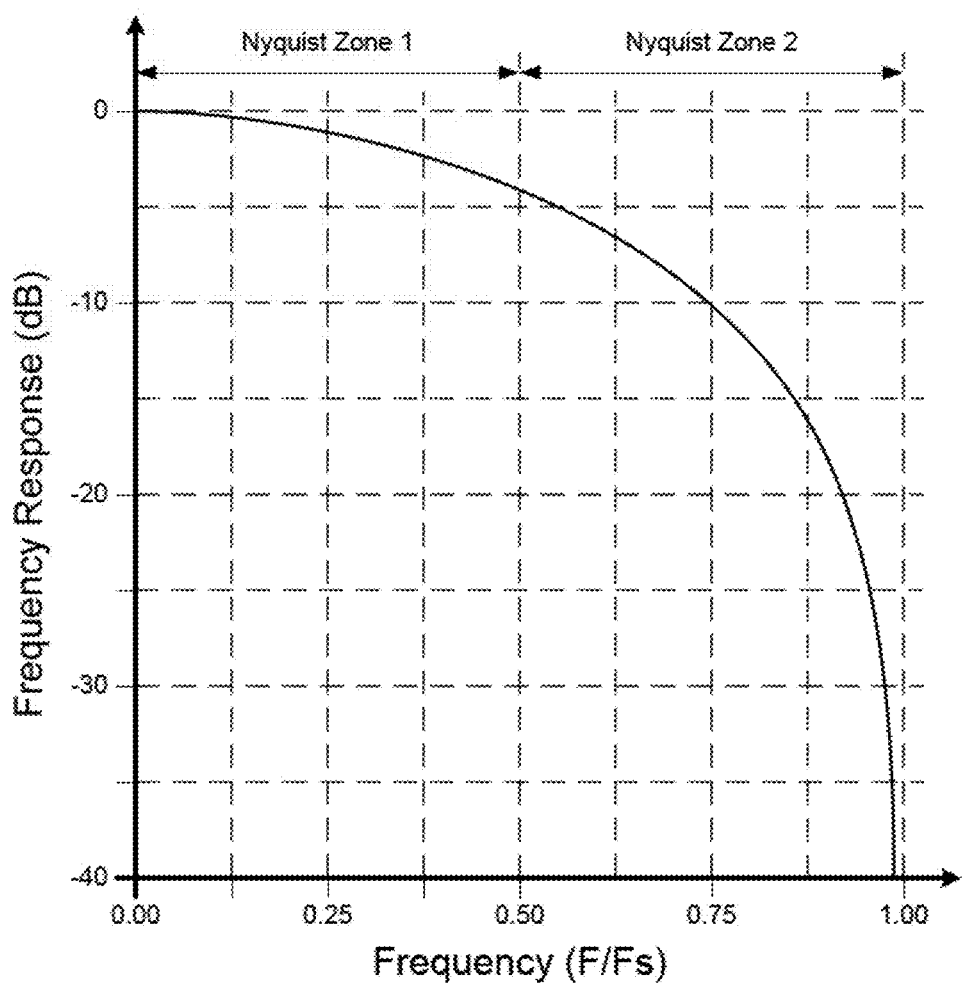
FIG. 3 is a graph showing a prior art DAC sin(x)/x Frequency Response.
Figure 4:
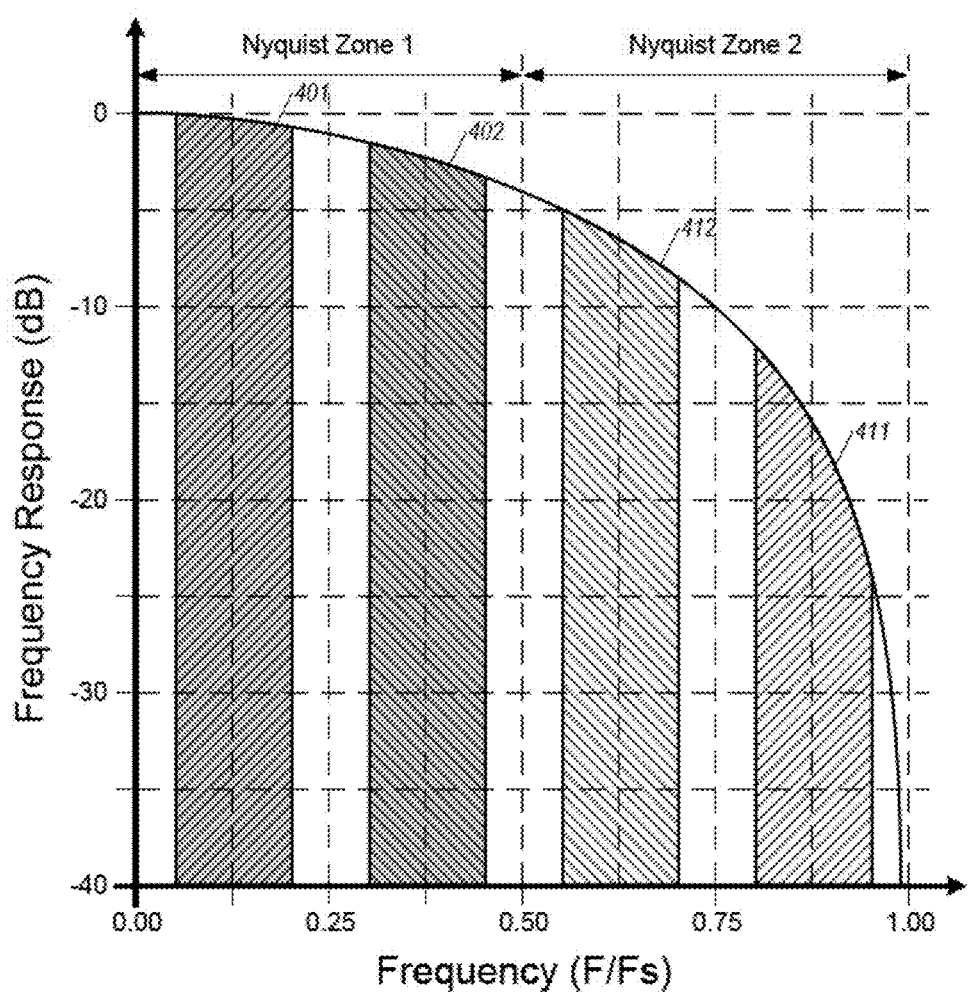
FIG. 4 is a graph showing a prior art RF DAC Images from Nyquist Zone 1.
Figure 5:
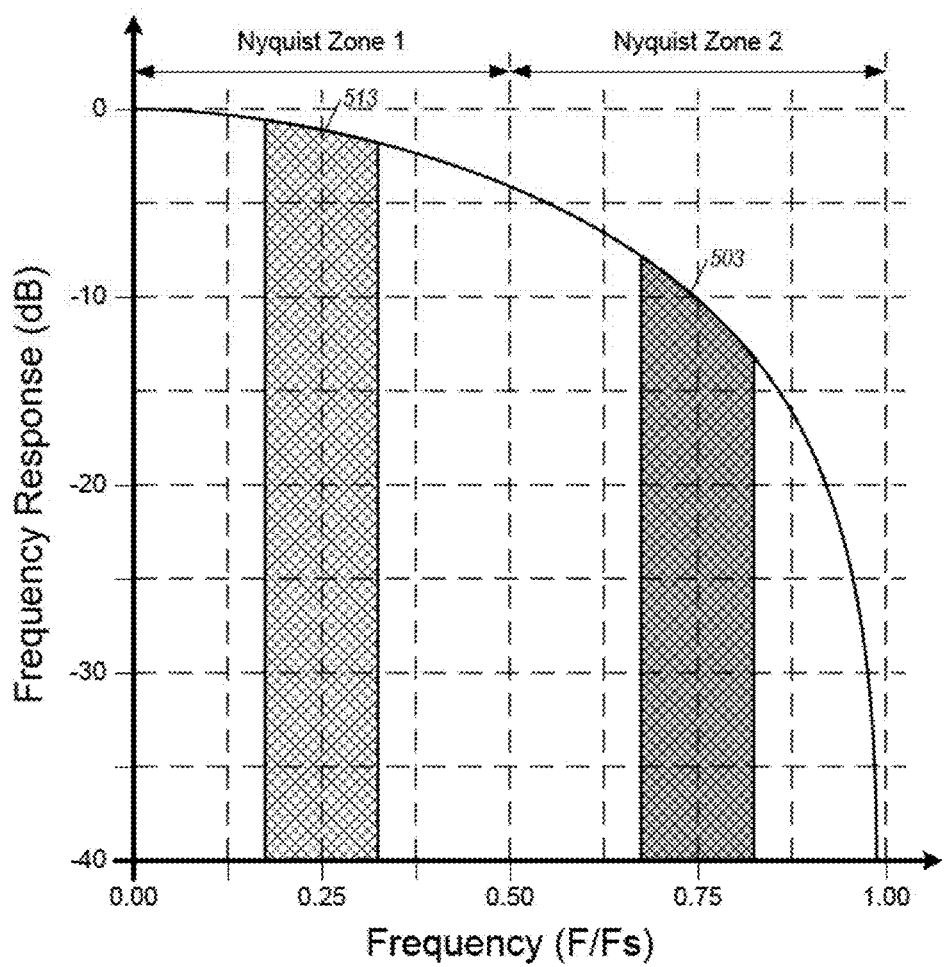
FIG. 5 is a graph showing prior art RF DAC Images from Nyquist Zone 2.
Figure 6:
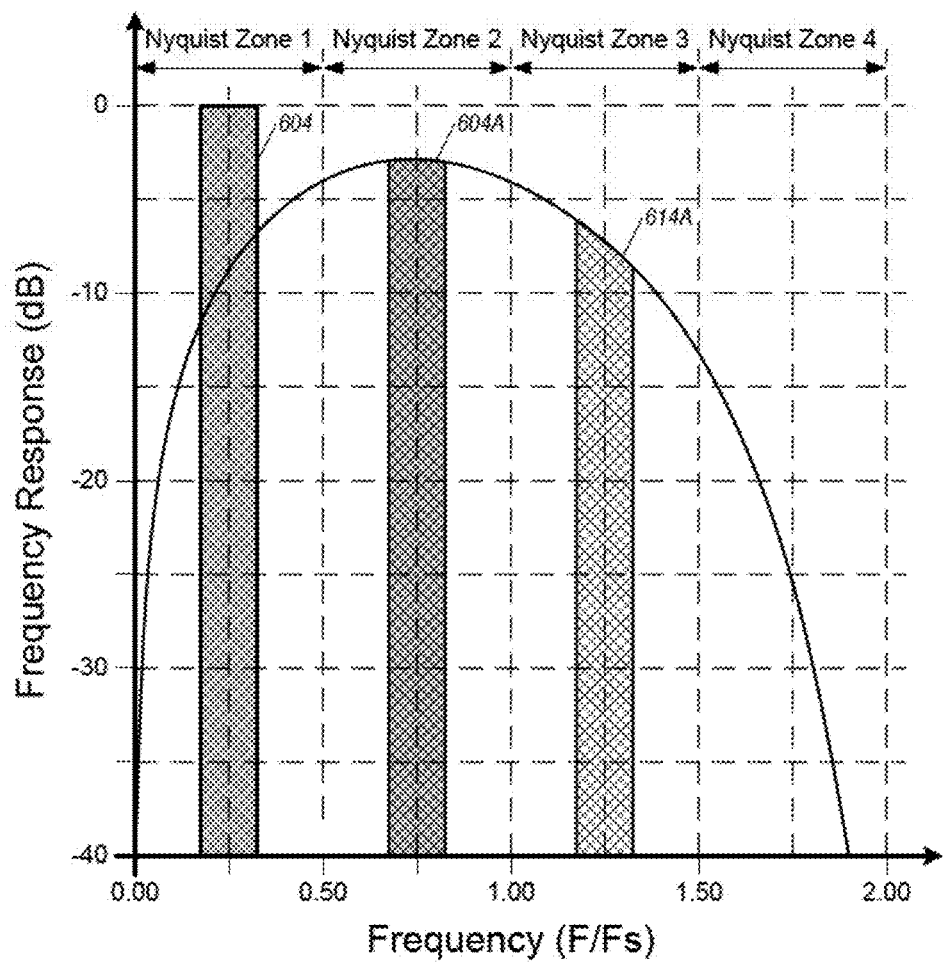
FIG. 6 is a graph showing a prior art Mix-Mode RF DAC Frequency Response and Images.
Figure 7:
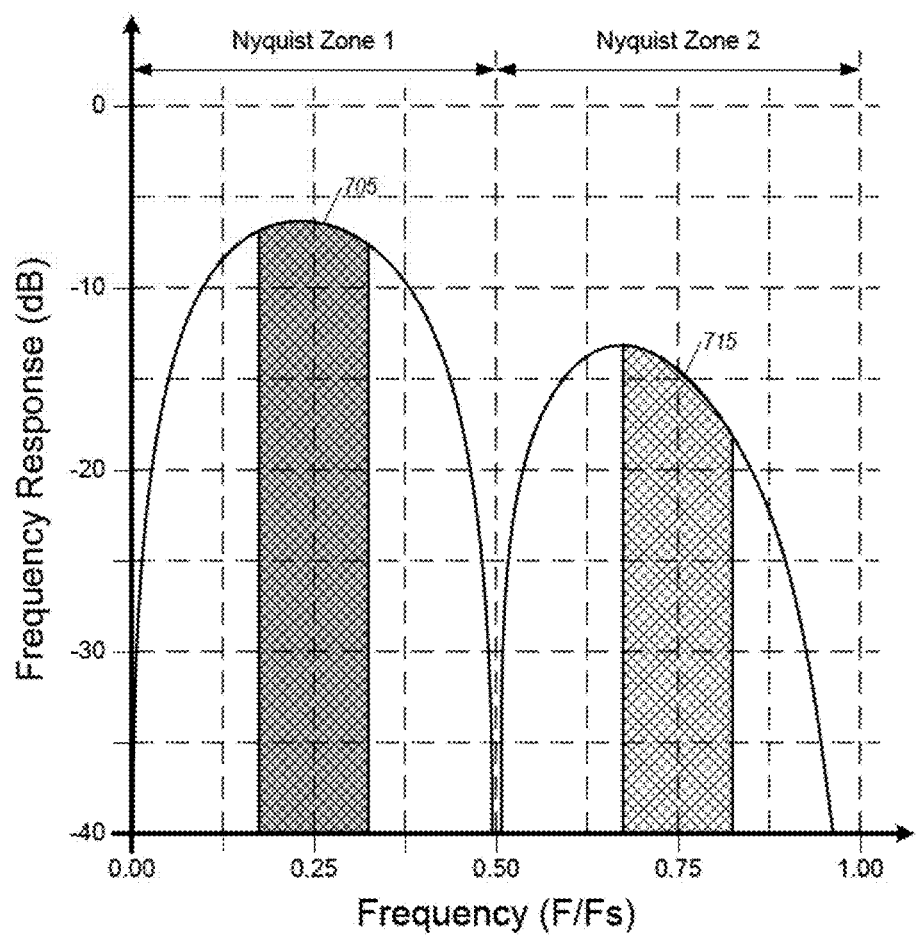
FIG. 7 is a graph showing a prior art RF DAC 'RFZ Mode' Frequency Response.

The first element of RF DAC embodiments of the present disclosure is the sample rate. Similar to the "RF Mode" DAC from FIG. 6 where successive output signals from an RF DAC are inverted, effectively multiplying a BB/IF signal by a repetitive "1, −1, 1, −1" signal to modulate from BB/IF to RF, there is a similar RF DAC mode, known as "RFZ" mode (Radio Frequency Return-to-Zero mode), where a real BB/IF signal, sampled at a sample frequency $Fs_1$, is effectively up-sampled to a sample frequency by $Fs=Fs_1·4$ by repeating samples and then multiplied by a repetitive "1, 0, −1, 0" signal. Overall, the RFZ DAC uses up-sampling to create multiple images of the real BB/IF, then uses a Finite Impulse Response discrete-time filter select the double-sided image entered around Fs·0.25 as the desired output. The frequency response of such an RFZ DAC is shown in FIG. 7, showing the modulated RF signal 705 (centered in the middle of Nyquist Zone 1, at Fs·0.25) and the image 715 (centered at Fs·0.75). The frequency response around signal 705 is quite flat, with approximately 7 dB of attenuation: 1 dB from sin(x)/x effects and 6 dB because the output is only active half the time because the RFZ DAC acts similar to a Return-to-Zero (RZ) DAC. The double-sided RF response is undesirable, but the flat frequency response and wide spacing from the signal to the image are both highly desirable. As a result of this, the RF DAC embodied in the present disclosure is constructed to operate with Fs=LO·4, which means for an LO that covers 400 MHz to 4 GHz, the RF DAC must cover a range of 1.6 Gsps to 16 Gsps.

Figure 8:
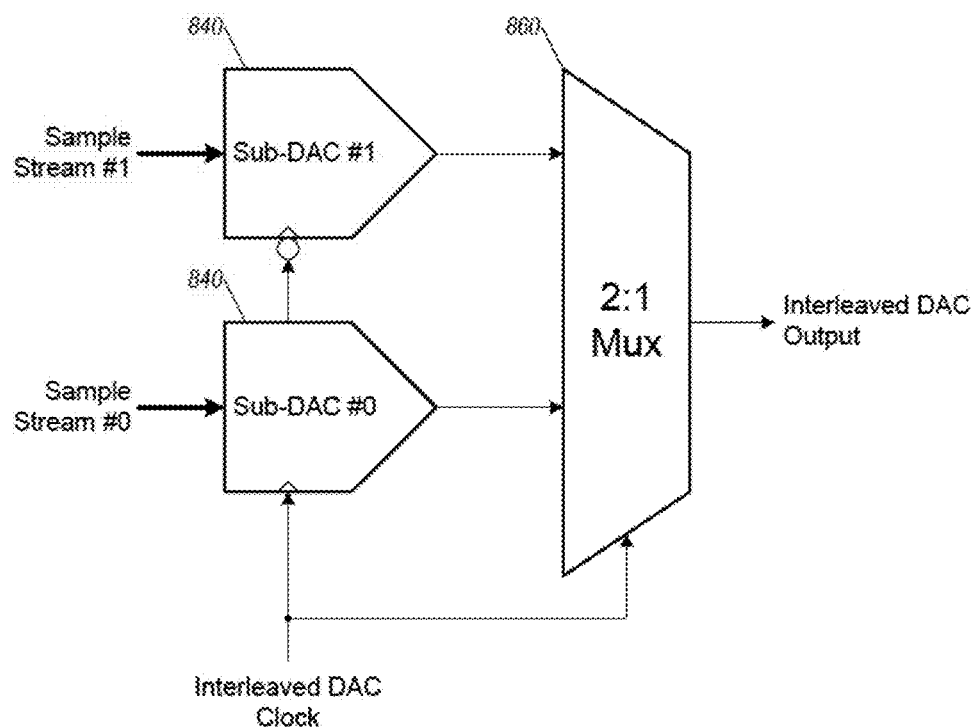
FIG. 8 shows a prior art 2-Way Interleaved DAC.

The second element of the architecture of RF DAC embodiments of the present disclosure is that it is a 2-way interleaved DAC. Many of the highest-speed DAC designs are constructed in two parts: a number of lower-speed Sub-DACs and an extremely high-speed analog multiplexer to time-interleave the Sub-DAC outputs together. A 2-way interleaved DAC, shown in FIG. 8, consists of two Sub-DACs 840 and a multiplexer 860. Each Sub-DAC operates at half the desired output sample rate, for example, 8 Gsps for each Sub-DAC for an effective output sample rate of 16 Gsps.

Figure 9:
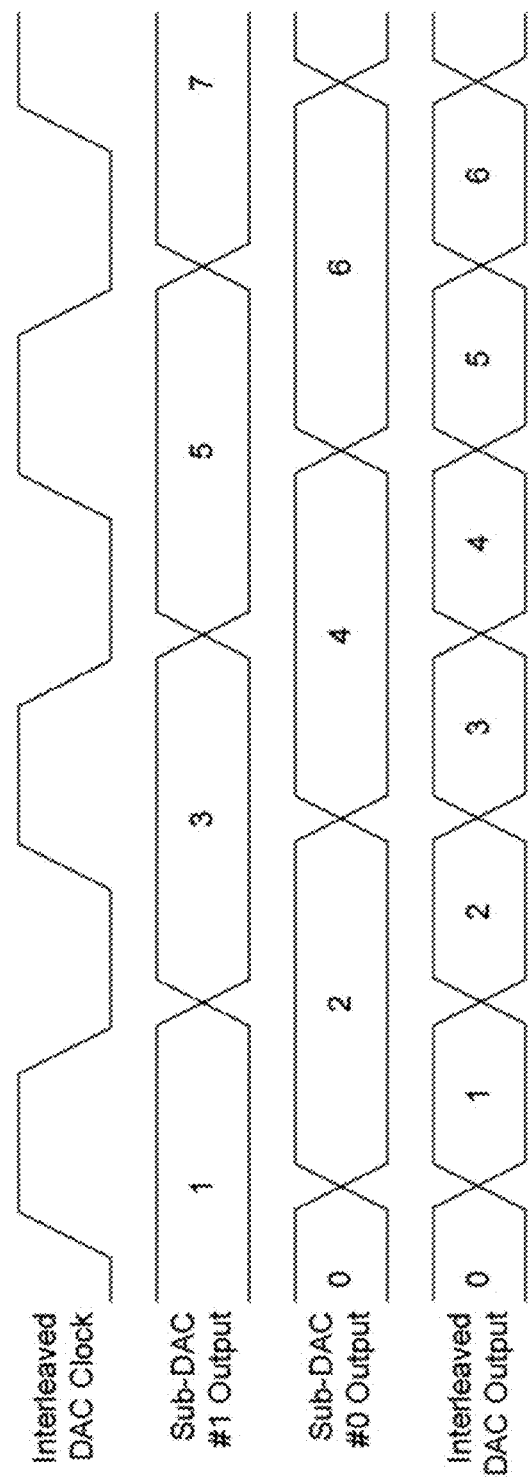
FIG. 9 shows a prior art 2-Way Interleaved DAC Timing Diagram.

The timing diagram of such an interleaved DAC is shown in FIG. 9. The output from Sub-DAC #0 transitions on the rising edge of the clock, while the output from Sub-DAC #1 transitions on the falling edge of the clock. The multiplexer 860 output is selected synchronously by the clock, and is selected during the time that the input is stable. Because the output transitions depend only on the multiplexer control input, any uncertainty on the transition times at the Sub-DAC outputs are irrelevant, which removes a major source of quantization noise in non-interleaved DACs, and in turn allows the latches that drive the Sub-DAC current steering outputs to be sized largely without consideration for mismatch. Given that the intended output sample rate is 16 Gsps (or any other suitable value) and power is an important system consideration, reducing the latch size (and power) is a significant improvement.

One downside to the interleaved architecture when combined with a current steering structure is that the Sub-DACs must always be enabled, therefore the 2:1 multiplexer must always steer the current from the un-used Sub-DAC to a low-impedance "dump" node, which effectively wastes 50% of the static bias power in the DAC structure. However comparing this wasted static power to the dynamic power saved in the DAC latches by going to the interleaved architecture shows an overall net power savings.

Figure 10:
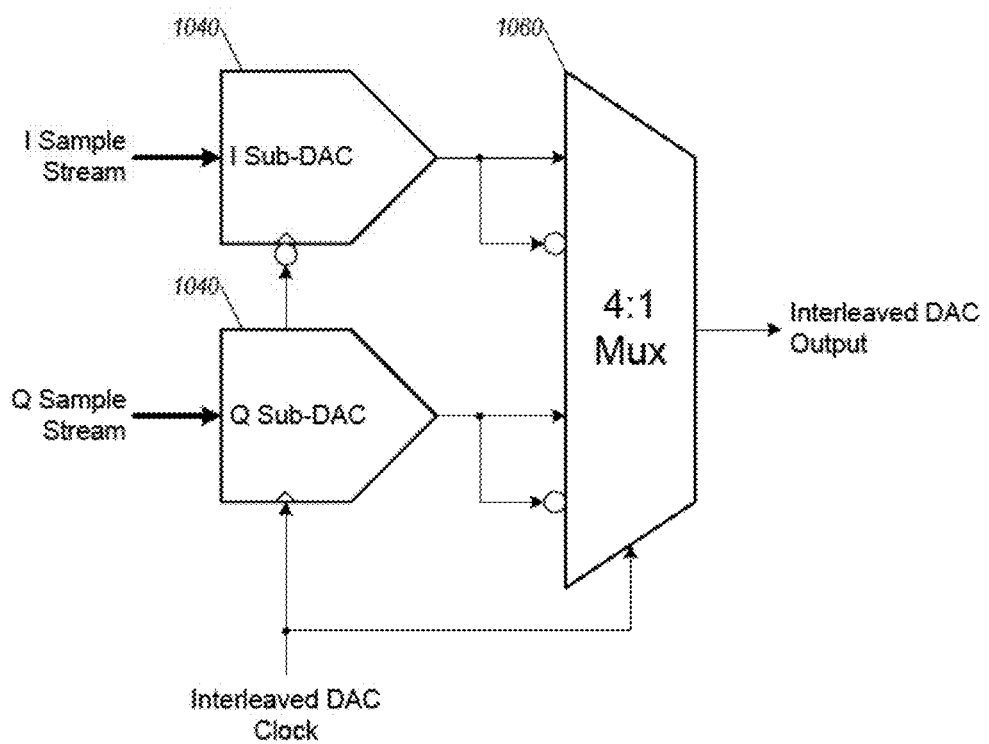
FIG. 10 is a 2-Way Interleaved DAC system in accordance with an embodiment of the present disclosure.

The third element of the architecture of RF DAC embodiments of the present disclosure involves combining the first two elements to build a 2-way interleaved RF DAC, as is shown in FIG. 10. Sub-DACs 840 are now I and Q Sub-DACs 1040 (in-phase Sub-DAC and quadrature-phase Sub-DAC), and the 2:1 multiplexer 860 is now the 4:1 multiplexer 1060, with the two additional inputs to the multiplexer being inverted versions of the two Sub-DAC outputs. In accordance with the present disclosure, a multiplexer unit is a functional block that receives the Sub-DAC's outputs, generates (or calculates) a complementary output of the Sub-DAC's outputs and generates an interleaved output signal that contains a repeating sequence using the Sub-DAC's outputs or their complementary outputs. The I and Q Sub-DACs produce a complex BB signal, so this RF DAC structure is capable of producing a single-sided output response, unlike the double-sided output response of an RFZ DAC.

Figure 11:
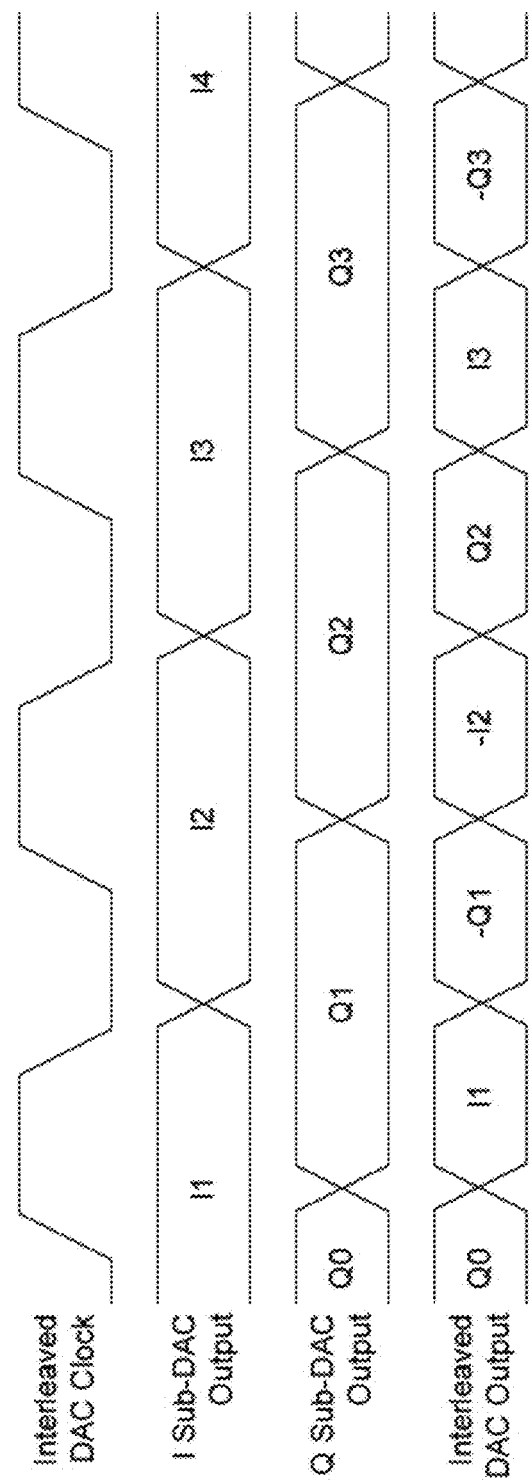
FIG. 11 shows a timing diagram for the DAC system of FIG. 10.

The timing diagram of such a 2-Way Interleaved RF DAC is shown in FIG. 11. Similar to the 2-Way Interleaved DAC of FIG. 9, inputs are selected based on the DAC clock, minimizing the effects of any timing uncertainty at the Sub-DAC outputs. The DAC clock has a 50% duty cycle. On alternate cycles, either the Sub-DAC outputs or their negative versions (complementary outputs) are selected, with the end result that the I Sub-DAC (as seen at the output) is effectively a full-rate signal multiplied by the sequence "1, 0, −1, 0" while the Q Sub-DAC is similarly effectively a full-rate signal multiplied by the sequence "0, −1, 0, 1". As a result, the complex BB signal at the output from the I and Q Sub-DACs is modulated up to the RF frequency Fs/4 directly with the full-rate output signals following the sequence "I, −Q, −I, Q". With this particular switching sequence, the 4:1 interleaving multiplexer is effectively operating as an AQM. While the two Sub-DACs each operate similar to an RFZ DAC with 6 dB of attenuation due to their RZ nature, the interleaving operation results in the overall RF DAC appearing as a conventional Non-Return-to-Zero (NRZ) DAC, meaning that the 6 dB attenuation due to the RZ coding is removed, leaving only the 1 dB attenuation due to sin(x)/x effects. In order to avoid signal images, this circuit requires that I and Q sample streams be aligned so that the Q signal stream is effectively delayed by a time equal to a quarter of the LO period.

Figure 12:
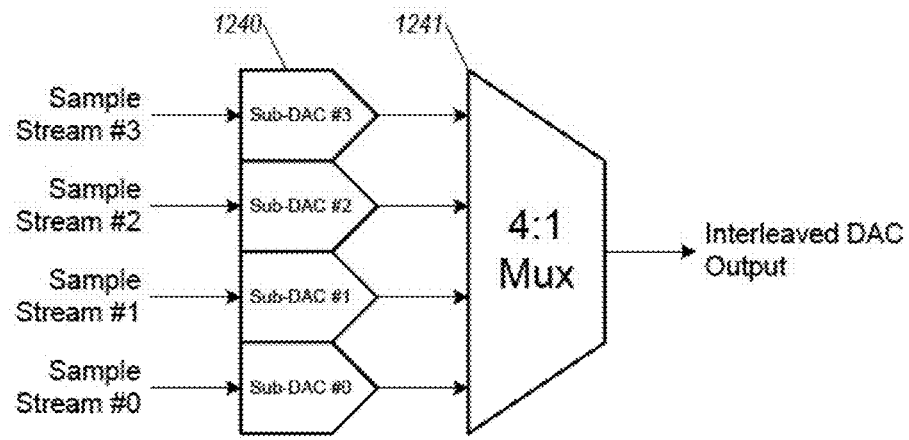
FIG. 12 shows a prior art 4-Way Interleaved DAC.

The fourth element to the architecture is to use a programmable summation based DAC to reduce the power required to build the I and Q Sub-DACs. Even with the reduction in power that comes from reducing the sample rate from the output sample rate of 16 Gsps to the Sub-DAC sample rate of 8 Gsps, building two 8 Gsps Sub-DACs is also power-prohibitive, so these Sub-DACs are also interleaved, this time 4 ways instead of 2 ways. A 4-way interleaved DAC is shown in FIG. 12. Similar to the 2-way interleaved DAC in FIG. 8, it consists of 4 Sub-DACs 1240 and a 4:1 multiplexer 1241, and it operates in a similar way. This reduces the DAC Fs by a factor of 4, from 8 Gsps to 2 Gsps.

Figure 13:
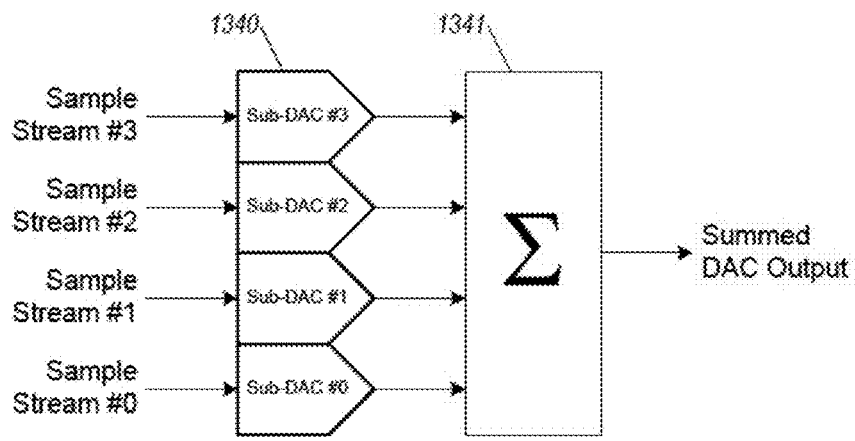
FIG. 13 shows a 4-Way Summed (Moving Average Filter) DAC system in accordance with another embodiment of the present disclosure.

However this particular structure can be quite power inefficient if the RF DAC is implemented as a current steering structure. As with the 2-way interleaved structure, each Sub-DAC must always be active, meaning that the 4:1 multiplexer must steer the current from any un-used DAC to a low-impedance "dump" node, effectively wasting 75% of the power. However, because the RF DAC structure of FIG. 10 requires that the I and Q Sub-DACs only produce low-frequency BB signals, another option, shown at FIG. 13, is used. In the structure of FIG. 13, the four Sub-DACs 1340 are summed together with a summation block 1341 rather than using a 4:1 multiplexer. A summation block can also be referred to as a summation device. This has two advantages: first, no static bias power is wasted and second, each of the Sub-DACs 1340 can be made one quarter the size of Sub-DACs 1240 saving yet more dynamic power.

Figure 14:
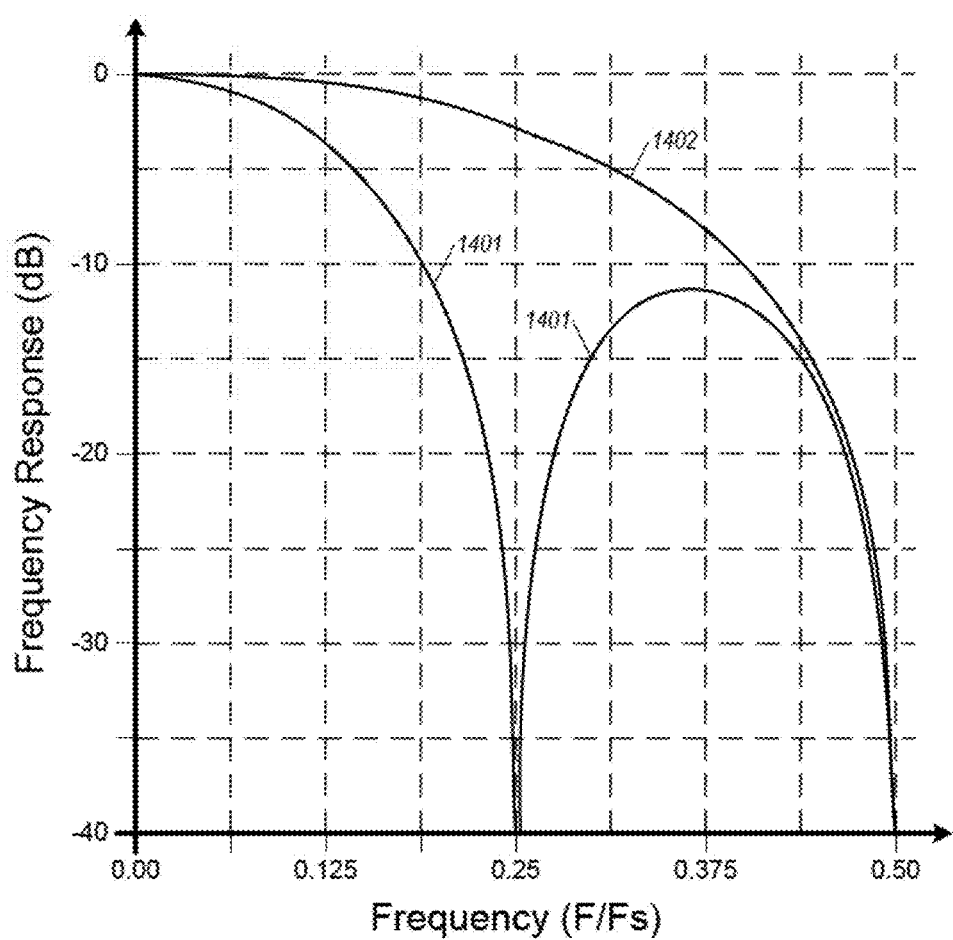
FIG. 14 is a 4-Tap and 2-Tap Moving Average Filter Responses in accordance with embodiments of the present disclosure.

This summation, however comes with downside: the summation of four Sub-DACs 1340 results in a 4-tap Moving-Average Filter (MAF, a Finite Impulse Response filter that produces the sum or average of a number of successive samples) response at the DAC output, 1401 in FIG. 14. It is important to note that Fs in this figure corresponds to Fs of the overall RF DAC, not the Fs of the I/Q Sub-DACs 1040 (FIG. 10) nor the Summed Sub-DACs 1340 (FIG. 13). This frequency response (which can also be referred to as a transfer function) can be corrected relatively easily by adding a simple fixed DSP equalizer to implement the inverse of the MAF response (an Inverse MAF or IMAF) in the digital circuits that precede the DAC. However, even with the IMAF the desire to cover wide RF bandwidths at low LO rates causes an issue. At LO=4 GHz and Fs=16 Gsps, we wish to have an RF bandwidth of at least 800 MHz, which corresponds to BB of 400 MHz, or Fs·0.05, which has an attenuation due to the MAF of less than 1 dB. However at LO=1 GHz and Fs=4 Gsps, we also wish to have an RF bandwidth of at least 800 MHz, which is again a BB of 400 MHz, or Fs·0.2. In this scenario, the attenuation at the band edge due to the 4-tap MAF is approximately 12 dB, which is prohibitive.

Figure 15:
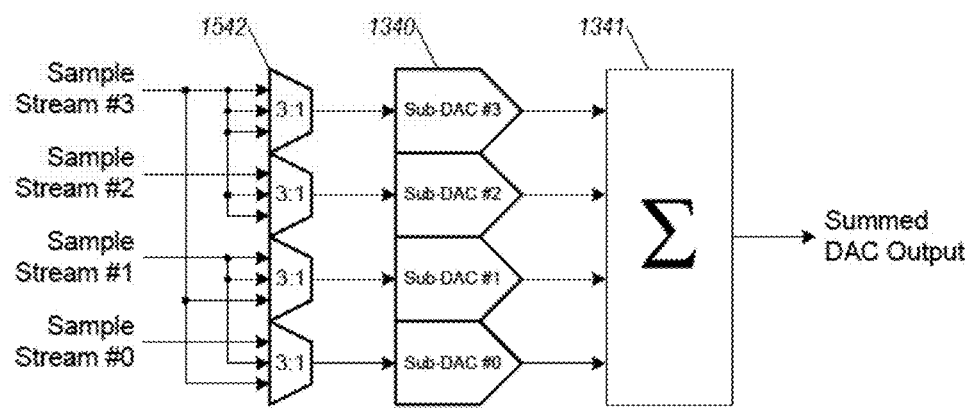
FIG. 15 shows an embodiment of a Programmable Summation DAC system in accordance with embodiments of the present disclosure.

Alternatively, in this same scenario we can instead use a 2-tap MAF (a MAF that sums together two inputs), which has the response 1402 in FIG. 14, and the loss due to the 2-tap MAF response across the signal band is approximately 1 dB, which again can be readily compensated for with a similar IMAF filter. In order to select between the 4-tap and the 2-tap MAF, the structure in FIG. 15 is used, which adds a set of digital multiplexers 1542 at the inputs to the Sub-DACs 1340 which allow the Sub-DACs to be driven in parallel at lower LO frequencies. The multiplexers 1542 that receive the I sample streams can be referred to as a switching unit and the multiplexers 1542 that receive the Q sample streams can be referred to as another switching unit.

For LO frequencies of 2-4 GHz, the four Sub-DACs are driven independently at sample rates of 1-2 Gsps and act as a 4-tap MAF. For LO frequencies of 1-2 GHz, the four Sub-DACs are driven in pairs at 1-2 Gsps, with Sub-DACs #3 and #2 driven together and Sub-DACs #1 and #0 driven together. This effectively results in there being two Sub-DACs, each double the size (with an additional bit of resolution) compared to the 2-4 GHz case, and there being a 2-tap MAF at the output. This can be continued at LO frequencies less than 1 GHz where all four Sub-DACs 1340 can be driven together, acting as a single large DAC (with two additional bits of resolution) without the MAF response. As will be clear to one skilled in the art, this technique is not limited to use with four Sub-DACs; for example it is possible to drive six Sub-DAC's as either six individual Sub-DAC's with a 6-tap MAF response, three pairs with a 3-tap MAF response, two groups of three with a 2-tap MAF response, or a single large group of six.

Figure 16A:
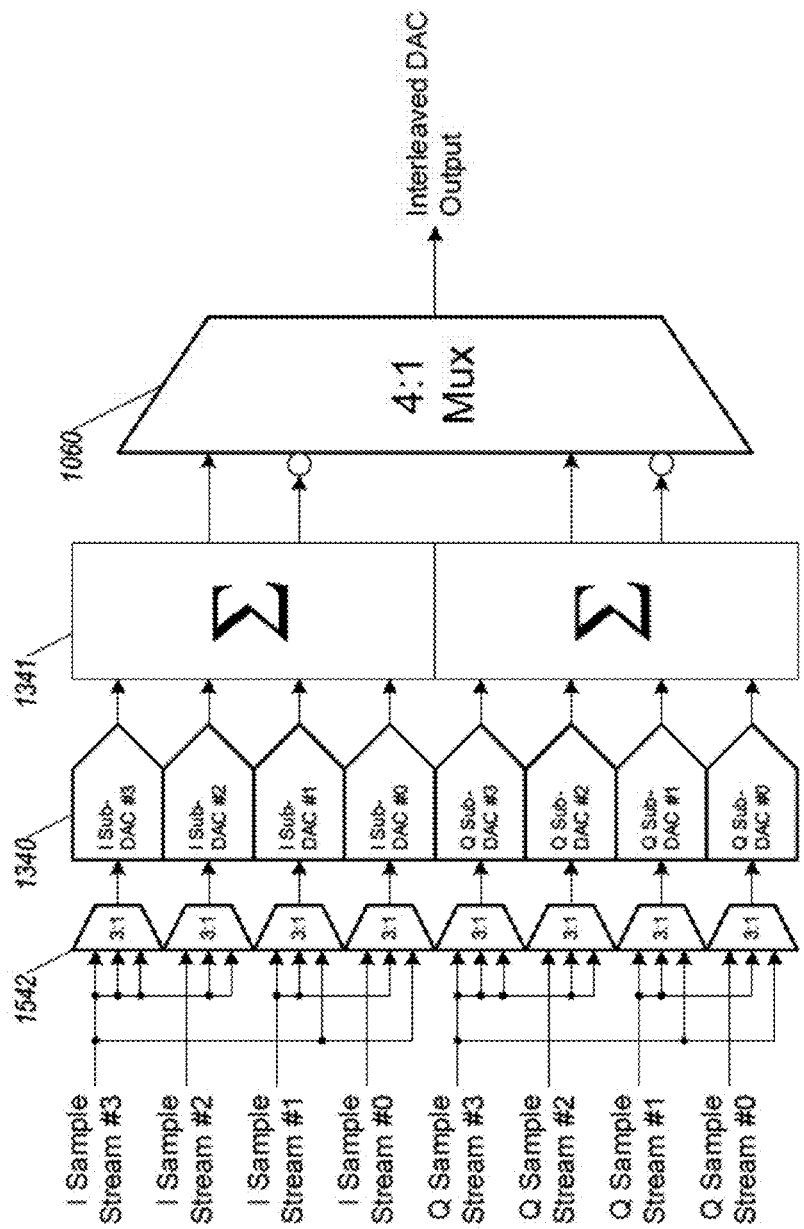
FIG. 16A shows an RF DAC Analog Block Diagram in accordance with embodiments of the present disclosure.

Combining the structure of FIG. 10 with the structure of FIG. 15 produces the analog block diagram of the complete RF DAC shown in FIG. 16A. The I/Q Sub-DACs 1040 are constructed of the input multiplexers 1542, the eight Sub-DACs 1340, and the summation blocks 1341. The summed outputs are combined by the 4:1 multiplexer 1060 to produce the final output. The output operates at a maximum sample rate of 16 Gsps, and each of the 8 Sub-DACs 1340 operates at a maximum sample rate of 2 Gsps. Depending upon the output sample rate and the required RF bandwidth, the 8 Sub-DACs 1340 are updated as 8 individual DACs, 4 pairs, or 2 quads.

Figure 16B:
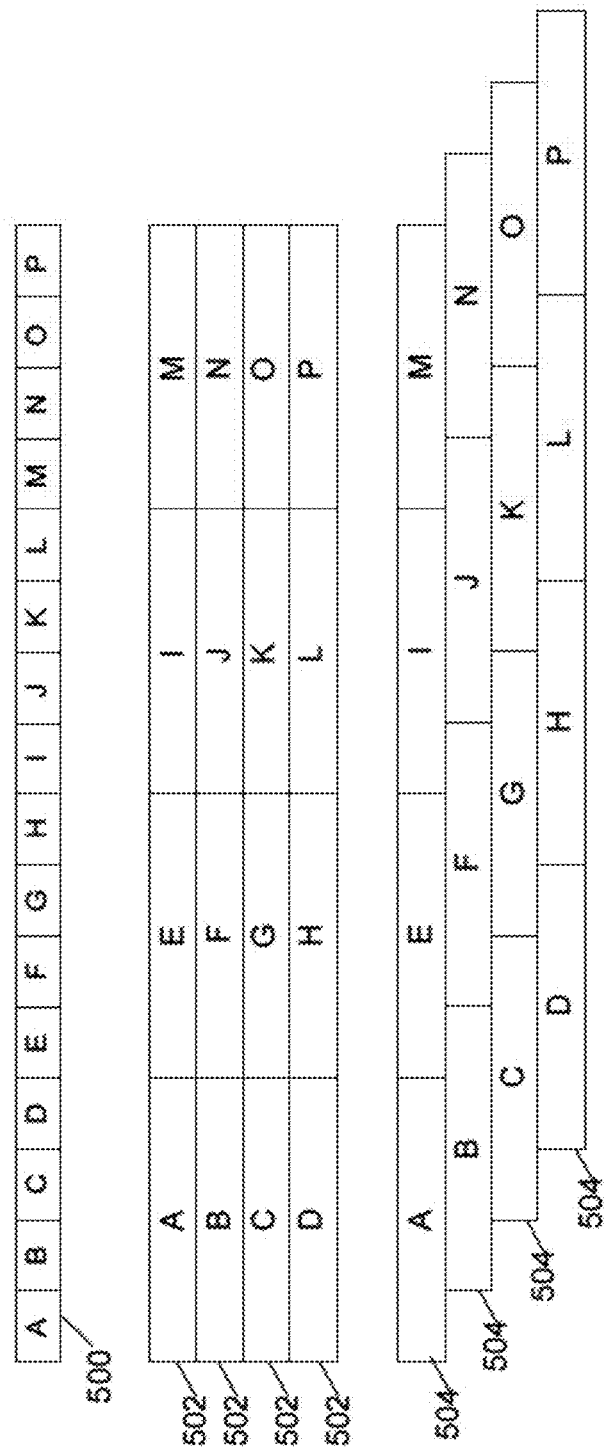
FIG. 16B shows how a serial stream is divided into four parallel offset sub-streams.

Each sub-stream input into each I Sub-DAC and each Q Sub-DAC stems from a respective I sample stream and a Q sample stream. FIG. 16B shows an example of an initial serial I or Q sample stream 500. This serial stream 500 is split into four parallel sub-streams 502 running at a lower sample rate, then each of the parallel sub-streams 502 is delayed by a different amount of time so that one sub-stream transitions every time the original serial stream transitioned. This produces four sub-streams 504 that are input into respective Sub-DACs. For applications where the four Sub-DACs are operating in two pairs, the initial serial I or Q data stream 500 is divided into two parallel offset sub-streams, and for applications where the four Sub-DACs are operating as a single larger DAC, the original serial I or Q data stream is used directly. As shown in FIG. 16B, the initial sample stream 500 is representable as sub-streams 504 that are interleaved with each other.

Figure 17:
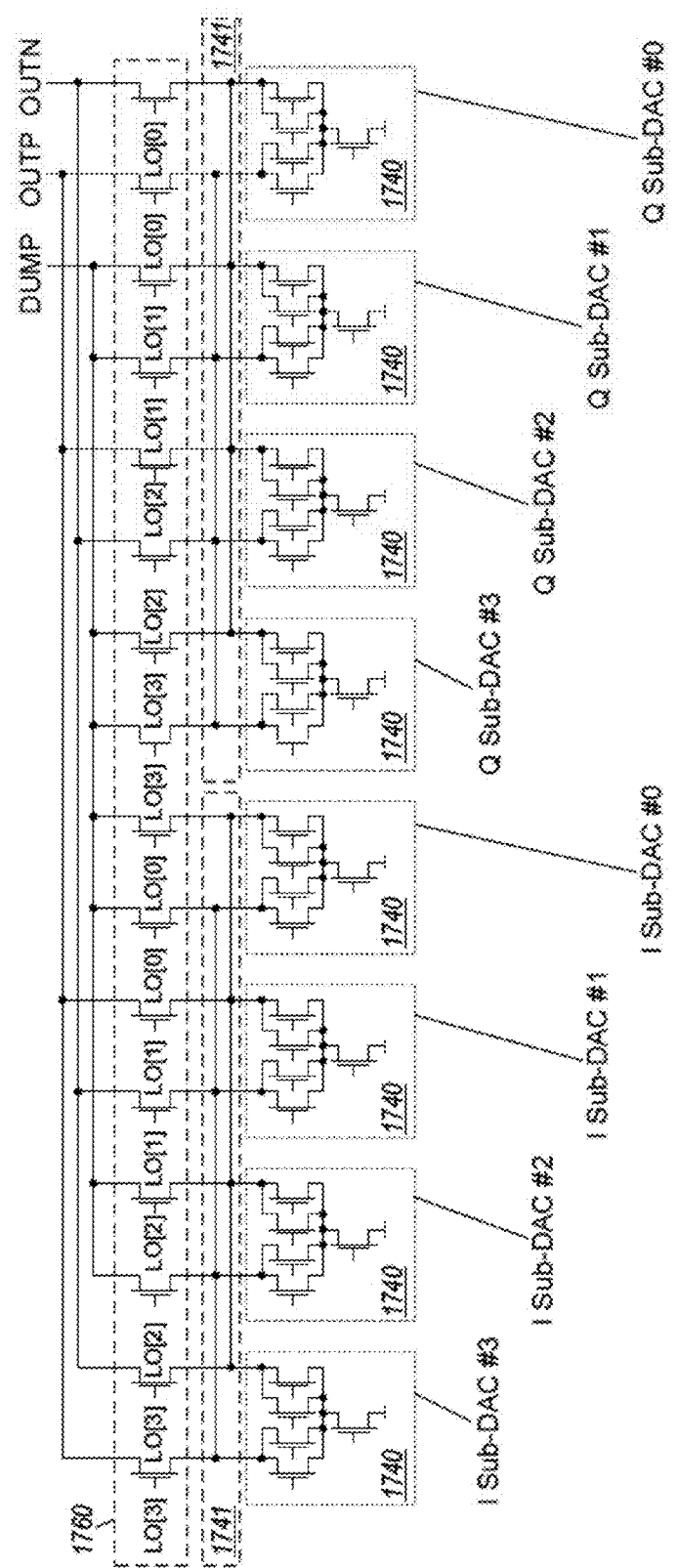
FIG. 17 shows an RF DAC Analog Transistor-Level Schematic in accordance with embodiments of the present disclosure.

An example of a practical transistor-level implementation of the analog portions (1340, 1341, and 1060) is shown in FIG. 17. This is an all-NMOS design, implemented using current steering techniques throughout. The I/Q Sub-DACs 1340 are shown as the DQS structures 1740. The detailed implementation of the DQS structures 1740 and the circuitry required to drive them is well known to those skilled in the art. Because the outputs from 1740 are current-mode, summation 1341 of FIG. 13 is performed simply by wiring the outputs in parallel, which is shown as functional block 1741 in FIG. 17. The 4:1 multiplexer 1060 is shown as the array of 16 NMOS transistors 1760, which steer the currents between the differential analog outputs OUTP/OUTN and the low-impedance DUMP node.

Figure 18:
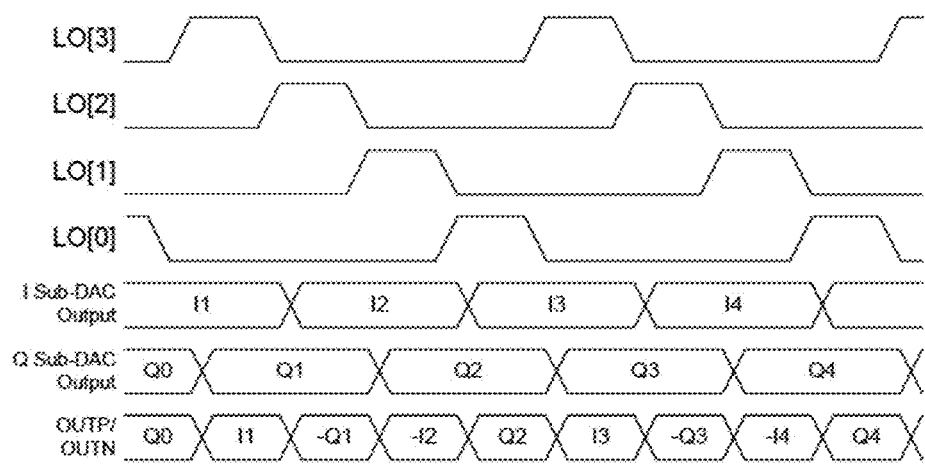
FIG. 18 shows an RF DAC Analog Timing Diagram in accordance with embodiments of the present disclosure.

The timing diagram for this circuit is shown in FIG. 18. The 4:1 multiplexer inputs LO[3:0] are a set of four 25% duty cycle clocks that successively connect the I or Q Sub-DACs to OUTP/OUTN or to DUMP.

In addition to the analog portions, the RF DAC requires a significant amount of digital support circuitry. A high-level block diagram showing the complete RF DAC transmit signal chain is shown in FIG. 19.

Figure 19:
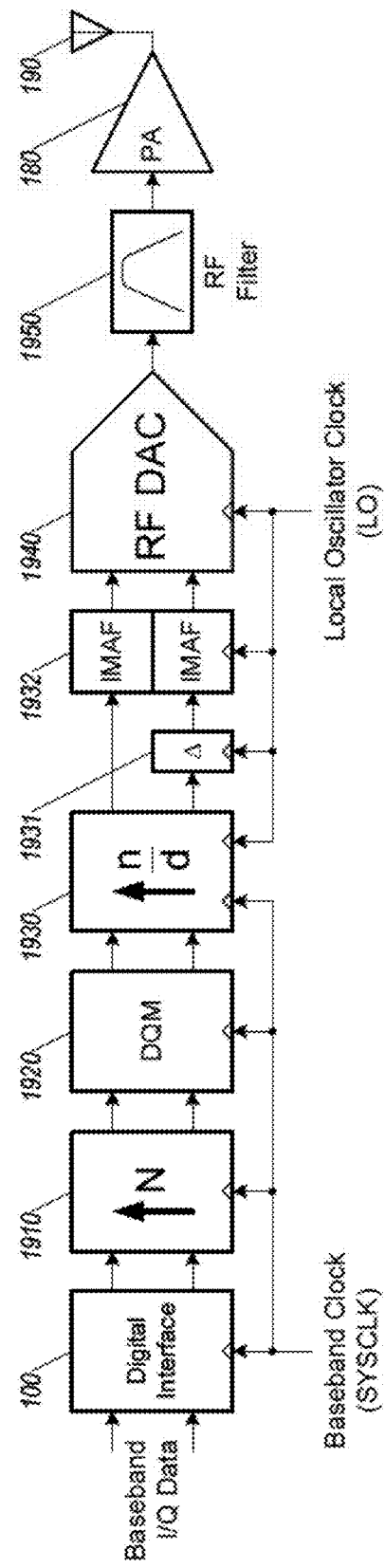
FIG. 19 shows a Two-Clock RF DAC Transmit Signal Chain in accordance with embodiments of the present disclosure.

Comparing FIG. 19 to FIG. 1 and FIG. 2, the design of FIG. 19 has the same digital interface 100. The interpolator 1910 and DQM 1920 are similar in functionality to that of 110 and 120, only needing to address IF modulation rather than RF modulation as in 210 and 220. An additional interpolator 1930 of FIG. 19 is an arbitrary interpolator, allowing sample rate conversion between the two clocks, SYSCLK and LO. An additional digital delay element 1931 is inserted in one of the two paths in order to align samples to the interleaved DAC and avoid images, and the IMAF blocks 1932 are used to compensate for the MAF response of the I/Q Sub-DACs. The RF DAC 1940 is the 2-way interleaved RFZ structure of FIG. 16A and FIG. 17. The output from the DAC is filtered by the RF Filter 1970 before amplification by the PA 180 for transmission over the antenna 190.

As with FIG. 1 and FIG. 2, the individual blocks are shown as if they are driven either by SYSCLK or by LO, where in reality they will likely be driven by clocks that are related to these clocks by integer factors, and these factors are application-dependent.

The arbitrary interpolation block 1930 is a flexible complex DSP engine, implementing a continuously-variable fractional delay filter. The implementation details of this block are, of necessity, well beyond the scope of this document, but it is important to note that its inclusion allows a great deal of flexibility, allowing digital control of delay and phase through the system, allowing synchronization of multiple RF DACs for Multi-Input/Multi-Output (MIMO) applications, and also allowing active compensation of I/Q delay mismatch within the RF DAC, mismatch that would result in interleaving distortion (similar to IQI and LOFT) at the output. In practice, the additional delay element 1931 can also be merged into 1930 as an additive delay applied to one of the paths.

Not shown, but likely to be included in a complete system, are additional digital blocks for adjusting I/Q gain and offset and a filter to compensate for the residual DAC sin(x)/x response. Because this RF DAC naturally operates with a sample rate Fs=LO·4, the sin(x)/x correction is comparatively minor, needing to correct only for approximately 1 dB of flatness compared to 10 dB or more that would be required for alternative RF DAC architectures that run with lower sample rates.

Figure 20:
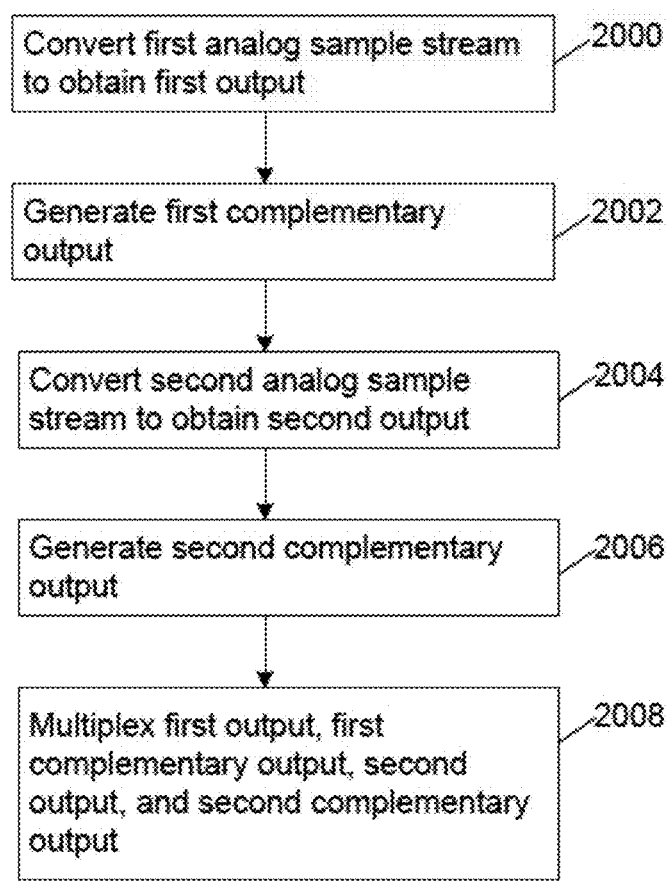
FIG. 20 is a flowchart of a method in accordance with embodiments of the present disclosure.

FIG. 20 shows a flowchart of a method of converting an analog signal into a digital signal, in accordance with certain embodiments of the present disclosure. At action 2000, a first analog sample stream is converted into a first output, which is digital. The first analog sample stream can be an in-phase sample stream or a quadrature-phase stream obtained from an initial analog signal. At action 2002, a complementary output of the first output is generated.

At action 2004, a second analog sample stream is converted into a second output, which is digital. The second analog sample stream will be an in-phase sample stream when the first analog stream is a quadrature-phase sample stream and vice-versa. At action 2006, a complementary output of the second output is generated.

At action 2008, the first output, the first complementary output, the second output, and the second complementary output are multiplexed to obtain an interleaved signal that contains a repeating sequence defined by: first output, second complementary output, first complementary output, and second output. At actions 2000 and 2004, the conversion of the first analog sample stream and of the second analog sample stream is effected in accordance with a local oscillator and, the repeating sequence spans a single period of the local oscillator.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure or portions of such embodiments can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A radio frequency digital-to-analog converter (DAC) system comprising:
   a first DAC to receive a first sample stream and to generate a first DAC output, the first sample stream being representable as first sub-streams that are interleaved with each other, the first DAC comprising a plurality of first Sub-DACs, each first Sub-DAC of the plurality of first Sub-DACs sampling a respective first sub-stream as a function of a respective clock signal, each first Sub-DAC generating a respective first Sub-DAC output, the first DAC further comprising a first summation device to receive and sum together the first Sub-DAC outputs to generate a first summed output, the output of the first DAC being equal to the first summed output, the first summed output being proportional to a moving average of the first Sub-DAC outputs;
   a second DAC to receive a second sample stream and to generate a second DAC output, the second sample stream being representable as second sub-streams that are interleaved with each other, the second DAC comprising a plurality of second Sub-DACs, each second Sub-DAC of the plurality of second Sub-DACs sampling a respective second sub-stream as a function of a respective second clock signal, each second Sub-DAC generating a second Sub-DAC output, the second DAC further comprising a second summation device to receive and sum together the second Sub-DAC outputs to generate a second summed output, the output of the second DAC being equal to the second summed output, the second summed output being proportional to the moving average of the second Sub-DAC outputs; and
   a multiplexer unit to obtain the first DAC output and the second DAC output, the multiplexer unit to calculate a complementary output from the first DAC output to obtain a complementary first DAC output and a complementary output from the second DAC output to obtain a complementary second DAC output, the multiplexer unit to generate an interleaved output signal that contains a repeating sequence defined by: the first DAC output, the complementary second DAC output, the complementary first DAC output, and the second DAC output, the first DAC and the second DAC being clocked by a local oscillator, the repeating sequence spanning a single period of the local oscillator, the system having a frequency transfer function that depends on the moving average of the first Sub-DAC outputs and on the moving average of the second Sub-DAC outputs.

2. The system of claim 1 wherein the first sample stream is one of an in-phase sample stream and a quadrature-phase sample stream, the second sample stream being the other of the in-phase sample stream and the quadrature-phase sample stream.

3. The system of claim 1 wherein the first sample stream is sampled at a rising edge of a clock signal and the second sample stream is sampled at a falling edge of the clock signal, the clock signal having a fifty percent duty cycle.

4. The system of claim 1 further comprising an inverse transfer function filter to filter the first input stream and the second input stream to prevent an effect of the frequency transfer function.

5. A method of effecting digital-to-analog conversion, the method comprising:
   converting a first analog sample stream into a first output, the first output being a first digital output, the first analog sample stream being representable as first sub-streams that are interleaved with each other;
   sampling each first sub-stream as a function of a respective clock signal to obtain respective first sub-outputs;
   summing together the first sub-outputs to generate a first summed signal, the first summed signal being equal to the first output, the first summed signal being proportional to a moving average of the first sub-outputs;
   generating a complementary output of the first output to obtain a first complementary output;
   converting a second analog sample stream into a second output, the second output being a second digital output, the second analog sample stream being representable as second sub-streams that are interleaved with each other;
   sampling each second sub-stream as a function of a respective clock signal to obtain respective second sub-outputs;
   summing together the second sub-outputs to generate a second summed signal, the second summed signal being equal to the second output, the second summed signal being proportional to a moving average of the second sub-outputs;
   generating a complementary output of the second output to obtain a second complementary output;
   multiplexing the first output, the first complementary output, the second output, and the second complementary output to obtain an interleaved signal that contains a repeating sequence defined by: the first output, the second complementary output, the first complementary output, and the second output, a conversion of the first analog sample stream and of the second analog sample stream being effected in accordance with a local oscillator, the repeating sequence spanning a single period of the local oscillator, the interleaved signal being a function of a frequency transfer function that depends on the moving average of the first sub-outputs and on the moving average of the second sub outputs.

6. The method of claim 5 wherein the first analog sample stream is one of an in-phase sample stream and a quadrature-phase sample stream, the second analog sample stream being the other of the in-phase sample stream and the quadrature-phase sample stream.

7. A radio frequency digital-to-analog converter (DAC) system comprising:
  a first DAC to receive a first sample stream and to generate a first DAC output, the first DAC comprising
    a plurality of first Sub-DACs, the first sample stream being representable as first sub-streams that are interleaved with each other;
  a second DAC to receive a second sample stream and to generate a second DAC output, the second DAC comprising a plurality of second Sub-DACs, the second sample stream being representable as second sub-streams that are interleaved with each other;
  a first switching unit to obtain the first sub-streams of the first sample stream, the first switching unit being configurable to:
    provide each of the first Sub-DACs a same first sub-stream of the first substreams;
    provide each of the first Sub-DACs a different first sub-stream of the first substreams; or
    provide distinct groups of first Sub-DACs with a single, distinct first sub-stream of the first sub-streams, each of the first Sub-DACs to output a respective first Sub-DAC output;
  a first summation device to obtain and sum together the first Sub-DAC outputs of the first sub-DACs to obtain a first summed output, the output of the first DAC being equal to the first summed output, the first summed output being proportional to a moving average of the first Sub-DAC outputs; a second switching unit to obtain the second sub-streams of the second sample stream, the second switching unit being configurable to:
    provide each of the second Sub-DACs a same second sub-stream of the second sub-streams;
    provide each of the second Sub-DACs a different second sub-stream of the second sub-streams; or
    provide distinct groups of second Sub-DACs with a single, distinct second sub-stream of the second sub-streams, each of the second Sub-DACs to output a respective second Sub-DAC output;
  a second summation device to obtain and sum together the second Sub-DAC outputs of the second sub-DACs to obtain a second summed output, the output of the second DAC being equal to the second summed output, the second summed output being proportional to a moving average of the second Sub-DAC outputs, the first summation device and the second summation device defining a frequency transfer function that depends on the moving average of the first Sub-DAC outputs and on the moving average of the second Sub-DAC outputs; and
  a multiplexer unit to obtain the first DAC output and the second DAC output, the multiplexer unit to calculate a complementary output from the first DAC output to obtain a complementary first DAC output and a complementary output from the second DAC output to obtain a complementary second DAC output,
  the multiplexer unit to generate an interleaved output signal that contains a repeating sequence defined by: the first DAC output, the complementary second DAC output, the complementary first DAC output, and the second DAC output, the first DAC and the second DAC being clocked by a local oscillator, the repeating sequence spanning a single period of the local oscillator.

8. The system of claim 7 further comprising an inverse transfer function filter to filter the first input stream and the second input stream to cancel an effect of the frequency transfer function.

9. The system of claim 7 wherein:
  the first switching unit comprises a number of first switching devices, each first switching device to obtain a respective first sub-stream;
  the second switching unit comprises a number of second switching devices, each second switching device to obtain a respective second sub-stream.

10. The system of claim 9 wherein the number of first switching devices is equal to the number of second switching devices.

11. The system of claim 10 wherein the first switching devices and the second switching devices include transistors.

12. The system of claim 7 wherein:
  there are as many first Sub-DACs as there are second Sub-DACs;
  when the first switching unit provides each of the first Sub-DACs the same first sub-stream, the second switching unit provides each of the second Sub-DACs the same second sub-stream;
  when the first switching unit provides each of the first Sub-DACs a different first sub-stream, the second switching unit provides each of the second Sub-DACs a same second sub-stream;
  when the first switching unit provides distinct groups of first Sub-DACs a single, distinct first sub-stream, the second switching unit provides distinct groups of second Sub-DACs a single, distinct second sub-stream.

13. The system of claim 12 wherein the first sample stream is one of an in-phase sample stream and a quadrature-phase sample stream, the second sample stream being the other of the in-phase sample stream and the quadrature-phase sample stream.

14. The system of claim 7 further comprising a digital delay element to delay the second input stream with respect to the first input stream by a time delay equal to one quarter of a period of the local oscillator.

15. The system of claim 7 wherein the first data stream and the second data stream are a function, respectively, of an initial first data stream and an initial second data stream each having data points inter-spaced in accordance with a same baseband clock frequency, the system further comprising an interpolator to generate additional data points between the data points of the initial first data stream and between the data points of the initial second data stream, an inter-spacing between the additional data points being a function of a frequency of the local oscillator.

16. The system of claim 15 wherein the interpolator comprises a digital delay element to delay the second input stream with respect to the first input stream by a time delay equal to one quarter of a period of the local oscillator.

* * * * *